United States Patent
Sittig et al.

(10) Patent No.: US 6,525,374 B1
(45) Date of Patent: Feb. 25, 2003

(54) SEMICONDUCTOR COMPONENT WITH A HIGH BREAKDOWN VOLTAGE

(75) Inventors: Roland Sittig, Braunschweig (DE); Detlef Nagel, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/830,535

(22) PCT Filed: Oct. 29, 1999

(86) PCT No.: PCT/DE99/03467

§ 371 (c)(1), (2), (4) Date: Jul. 16, 2001

(87) PCT Pub. No.: WO00/26968

PCT Pub. Date: May 11, 2000

(30) Foreign Application Priority Data

Oct. 29, 1998 (DE) .......................... 198 49 902

(51) Int. Cl.⁷ ............................................. H01L 29/76
(52) U.S. Cl. .................. 257/339; 257/458; 257/342; 257/461; 257/147
(58) Field of Search ...................... 357/13, 39; 257/138, 257/147, 458, 461, 342, 339

(56) References Cited

U.S. PATENT DOCUMENTS 6,097,063 A * 8/2000 Fujihira ........................ 257/339
6,207,994 B1 * 3/2001 Rumennik et al. .......... 257/342

FOREIGN PATENT DOCUMENTS

| DE | 1614440 | 7/1970 | |
| DE | 4309764 A1 | 9/1994 | ......... H01L/29/784 |
| DE | 19604043 A1 | 8/1997 | ........... H01L/29/78 |
| EP | 0818 825 A1 | 1/1998 | ........... H01L/27/08 |
| WO | WO83/00582 | 2/1983 | ......... H01L/29/747 |

* cited by examiner

Primary Examiner—Sara Crane
Assistant Examiner—Junghwa Im
(74) Attorney, Agent, or Firm—Laurence A. Greenberg; Werner H. Stemer; Gregory L. Mayback

(57) ABSTRACT

The invention relates to a semiconductor component with a base zone (3) extending in a lateral direction (x) of a first type of conductivity (n) and at least two contact areas (1, 2) for connection to electric contacts (A, K) which zones are separate at least from the base zone (3) in the lateral direction (x). A base material of the base zone (3) is silicon (Si) and has a dopant concentration of $10^{12}$ to $5 \times 10^{14}$ cm$^{-3}$ and a respective dopant concentration ($N_A$) along a lateral direction (x) of less than $2 \times 10^{12}$ cm$^{-2}$ determined by integrating the dopant concentration across the vertical thickness of the base area (3). The semiconductor component further comprises compensation layers (6, 6a, 6b, 6c, 7, 7a, 7b, 7c, 8) of a second type of conductivity (p) opposed to the first type of conductivity. Said layers extend inside or outside the base area in a lateral direction (x).

19 Claims, 6 Drawing Sheets

SEMICONDUCTOR COMPONENT WITH A HIGH BREAKDOWN VOLTAGE

The invention relates to a semiconductor component with a low-doped base region of the first conductivity type extending in the lateral direction (x) and two terminal areas which are separated at least by the base region in the lateral direction for connection to electrical contacts.

These semiconductor components are used especially in power electronics to accommodate blocking voltages in the high voltage range, i.e., the kV range. Here the low-doped base which is made especially as a n$^-$-base is used to accommodate blocking voltages. The high voltage on the contacts is distributed accordingly over the entire semiconductor component, the variation of the high electrical field strength being adjusted in the base region. Since the voltage is an integral of the electrical field strength over the lateral direction and the allowable field strength in the semiconductor material, generally silicon, is limited by the pertinent breakdown field strength, these components are produced with a great lateral extension of the base region.

To achieve breakdown voltages as high as possible, a slope of the electrical field-strength distribution which is as small as possible and thus doping of the base region as low as possible are necessary. The allowable maximum base doping drops with increasing breakdown voltage. With respect to the required cosmic radiation resistance of the components they must be dimensioned such that the maximum attained electrical field strength is clearly below the breakdown field strength of the semiconductor material used, by which the essentially attainable blocking voltage is further reduced.

A further reduction of the blocking voltage which can be accomplished with a stipulated doping arises in so-called punch-through dimensioning for improving the on-state behavior, for which the base width of the components is chosen such that the electrical field at higher blocking voltages extends as far as the cathode emitter. An increase of the allowable blocking voltage is thus only possible by using semiconductor material with lower doping than the commercial starting material, but one such lower-doped semiconductor material cannot be economically produced.

Thus, when using commercial starting material, for example silicon with minimum doping of roughly $5\times10^{12}$ cm$^{-3}$, components with breakdown voltages up to roughly 10 kV can be produced. Higher blocking voltages can only be accomplished by series connection of several components, for example stacked diodes. Since in the conducting state for each of the series connected components at least the diffusion voltage is necessary, these components have poor on-state behavior with a correspondingly high voltage drop.

DE 43 09 764 C2 shows a component with a base consisting of several thin successive layers which are alternately p-doped or n-doped. The dopant content in each individual layer is quantitatively the same and is so low that they are completely cleared at very low blocking voltages. For this purpose complex formation of successive layers of very low thickness with relatively high doping is accordingly necessary so that production is complex and expensive.

DE 196 04 043 A1 shows a semiconductor component which can be controlled by a field effect, with a drain zone of the first conductivity type, a gate electrode which is insulated relative to the drain zone, and a source region of the second conductivity type, made in the drain zone. In the drain zone, areas of the first and second conductivity type are formed, the concentration of the added n-regions corresponding roughly to the concentration of added p-regions. EP 0 818 825 A1 shows a thyristor in which the anode regions are separated from he cathode region among others by a doped substrate region. On the outer edge of the substrate area layers are formed which are of one conductivity type which is opposite the conductivity type of the substrate area.

The latter two publications are however not suited for high voltage applications as a result of their structure.

The object of the invention is to be able to produce a semiconductor component easily and economically and to enable use at high blocking voltages.

This object is achieved by the base material of the base region (3) being silicon (Si) and the dopant concentration of $10^{12}$ to $5\times10^{14}$ cm$^{-3}$ and the dopant concentration ($N_A$) determined by integration of the dopant concentration over the vertical thickness of the base region (3) along the lateral direction (x) being each less than $2\times10^{12}$ cm$^{-2}$, by there being compensation layers (6, 6a, 6b, 6c, 7, 7a, 7b, 7c, 8) of the second conductivity type (p) opposite the first conductivity type which extend inside or outside the base region in the lateral direction (x), the lateral length ($l_K$) of the compensation layers being greater than their vertical thickness ($d_6$, $d_7$) and the dopant surface concentration ($N_A$) which is determined by integration of the dopant concentration over the vertical thickness of a compensation layer along the lateral direction (x) being less than $1\times10^{12}$ cm$^{-2}$.

The compensation layers can run on the outside of the base region or also within the base region. Here it is fundamentally also possible for the compensation layers to extend not only in the lateral direction, but also roughly in the vertical direction in their variation.

The invention is based on the idea of at least partially compensating for the space charge in the base region by layers of opposite doping which run essentially parallel thereto. Here individual sections can be made along the lateral direction, in which this compensation turns out to be of a different magnitude, and in part also complete compensation can be achieved, or overcompensation in which upon integration over the vertical thickness there is a higher dopant content of the compensation layers. Advantageously, in the compensation layers the dopant concentration is less than that breakdown dopant concentration which corresponds to the breakdown field strength of he corresponding semiconductor material. The semiconductor material can be especially the silicon which is conventional for power semiconductor components with doping of $10^{12}$–$10^{13}$, especially $3\times10^{12}$–$10^{13}$. Thus, semiconductor components for applications preferably in the range 10–30 kV can be formed.

The terminal regions can consist especially of a highly doped semiconductor material.

The terminal regions can be especially an anode region of p$^+$-conductive semiconductor material and a cathode region of n$^+$-conductive semiconductor material.

The invention is detailed below using the attached drawings on embodiments.

FIG. 1a shows a high voltage diode with punch-through dimensioning as the first embodiment of the invention;

FIG. 1b shows a diagram of the electrical field in the diode from FIG. 1a;

FIG. 2b shows a diagram of the electrical field within the diode from FIG. 2a;

Figures 1A, 1B:
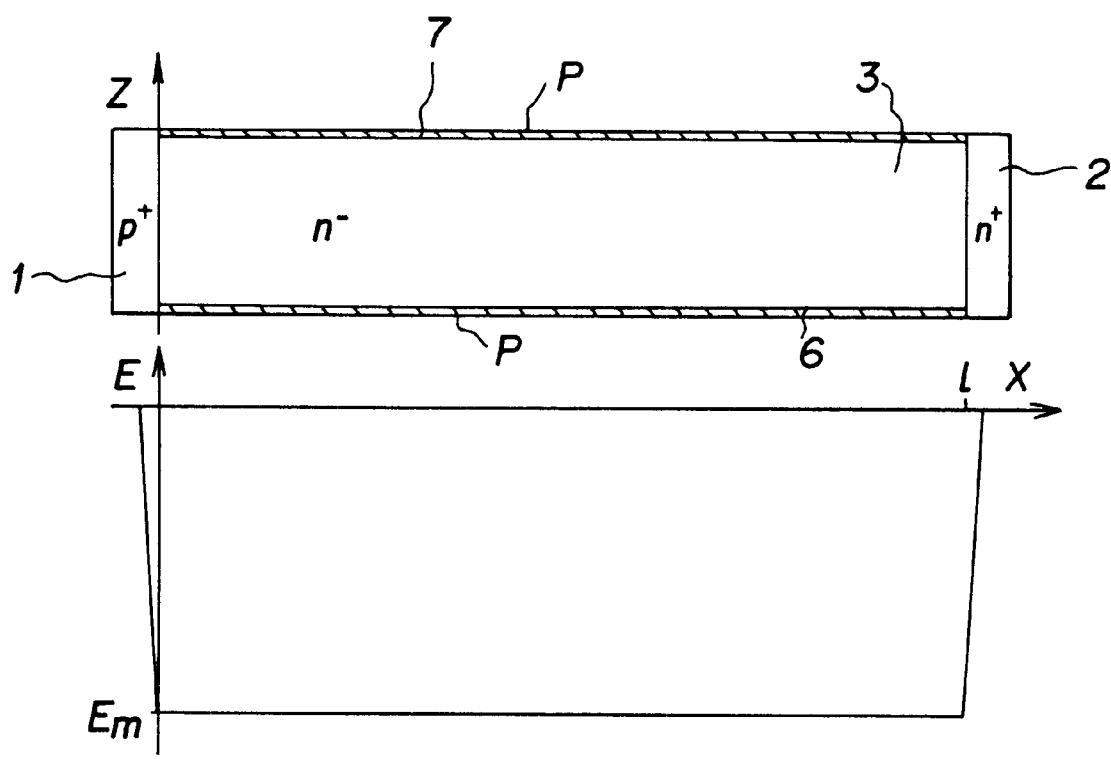

A high voltage diode as shown in FIG. 1a has a $p^+$-conductive anode region 1 and a $n^+$-conductive cathode region doped $n^-$-base region 3 in the lateral direction x. The lateral length l of the base region 3 is thus greater than the vertical thickness $d_B$.

As claimed in the invention, there are compensation layers 6 and 7 on the outer sides of the base region 3 and they have a charge carrier type which is opposite the charge carrier type of the base region, here therefore p-conductive. The dopant concentration $N_A$ in the compensation layers 6, 7 is chosen here such that it corresponds to the dopant concentration in the base region 3 between the compensation layers or is somewhat less. FIG. 1b shows the distribution of the electrical field strength in the diode in which the space charge of the $n^-$-base and the space charge of the p-conductive compensation layers 6, 7 are compensated with corresponding integration over the z direction. The field strength in the anode area 1 thus drops to a value $E_m$, remains constant over the lateral length 1 of the base region 3 since the surface charge density in the x direction likewise remains constant, and increases again in the cathode region 2 to zero. The entire voltage drop is formed as the integral of the field strength E over the lateral extension x. Based on the flat distribution of the electrical field strength E over x, the field strength at any time can be less than the breakdown field strength of the silicon material used and still a large integral (area under the curve) can be achieved. This diode can be dimensioned especially in punch-through dimensioning to improve the on-state behavior in which the base width is chosen such that the electrical field at higher blocking voltages extends into the cathode region 2.

Figure 2A:
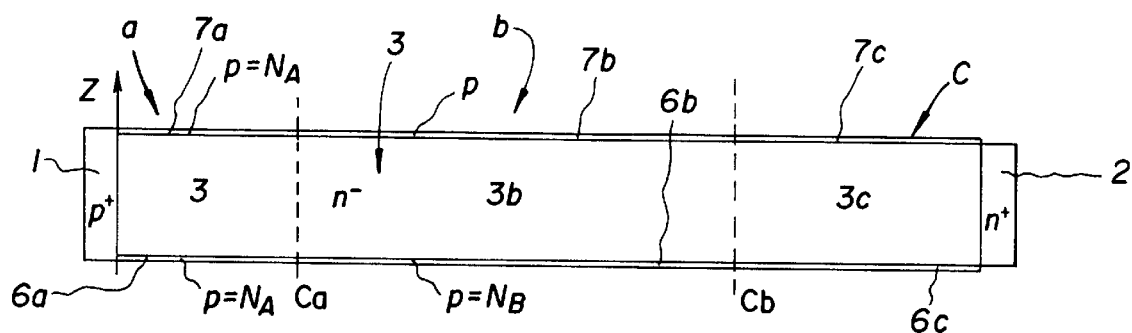
FIG. 2a shows a high voltage diode with non-punch-through dimensioning as the second embodiment of the invention.
Figure 2B:
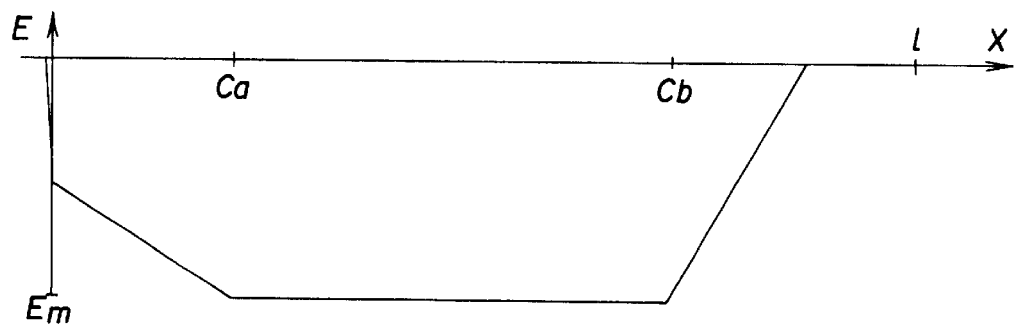

FIG. 2 shows a high voltage diode in which in contrast to FIG. 1 the compensation layers 6 and 7 are changed in the lateral direction x. Thus, sections a, b and c in the lateral direction are made in succession; for them there are different dopant concentrations in the layers 7a, 7b, 7c, 6a, 6b, 6c. In the example shown in diagram 2b, in section a, i.e. in the entire volume from 0 to 1a, the overall doping of the compensation layers 6a and 7a is greater than the doping of the corresponding section 3a of the base region so that the field strength in region 3a continues to drop towards the cathode. In section b (between 1a and 1b) the overall doping of the compensation layers 6b and 7b is equal to the doping of the base region 3b so that the field strength remains constant here; in section c the overall doping of the compensation layers 6c and 7c is less than the overall doping of the corresponding section 3c of the base region; optionally in this section c the compensation layers 6c and 7c may not be doped at all. As shown in FIG. 2b, the possible result is thus that the electrical field strength does not extend into the cathode region 2 so that a high voltage diode in non-punch through dimensioning results.

Thus it is possible, with maximum field strengths clearly below the breakdown field strength of the semiconductor material, here silicon, to achieve blocking voltages which are dependent only on the distance between the anode and the cathode and thus can be much higher than the values which are achieved with conventional components. If for example we assume a starting material with doping of $10^{13}$ $cm^{-3}$ and a thickness of 200 microns, with a maximum field strength of roughly 60% of the breakdown field strength at a distance of 3 mm between the anode and cathode, a blocking voltage of 30 kV can be attained.

Figure 3:
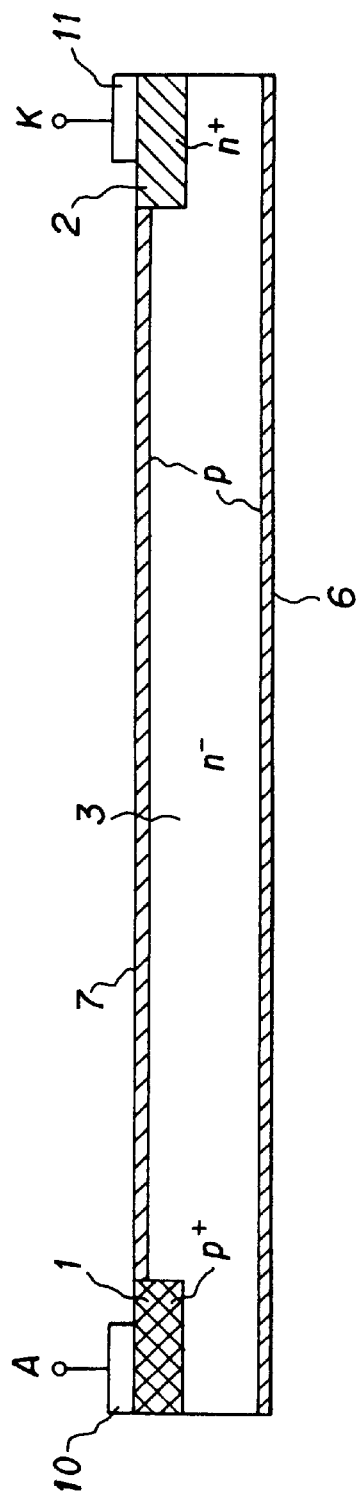
FIG. 3 shows a high voltage diode as the third embodiment of the invention.
Figure 4:
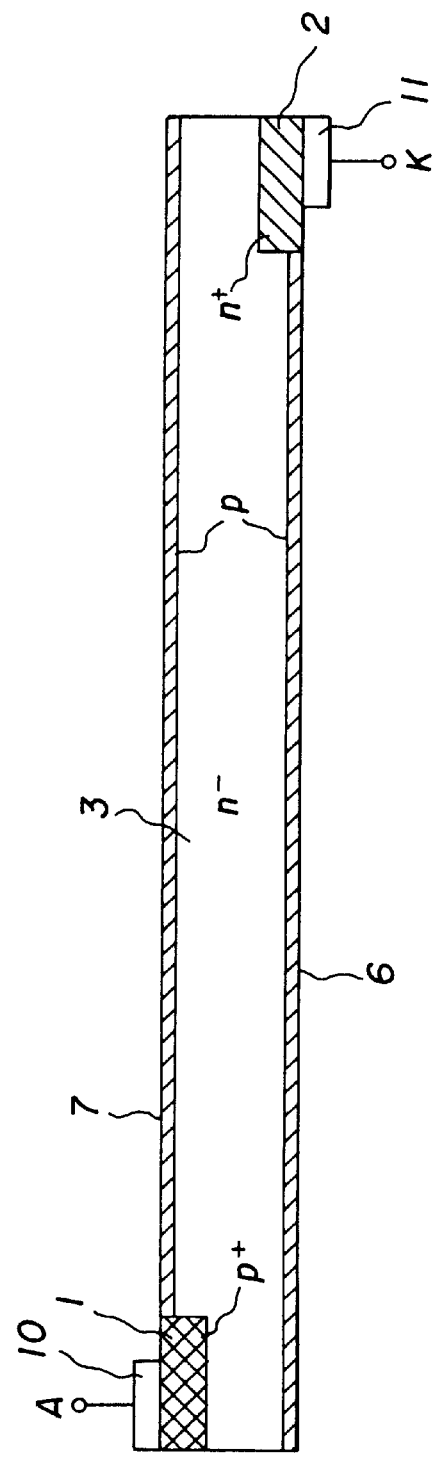
FIG. 4 shows a high voltage diode as the fourth embodiment of the invention.

FIGS. 3 and 4 correspond to FIGS. 1 and 2, here the anode region 1 and the cathode region 2 not extending over the entire vertical thickness of the base region 3. Thus the anode region 1 and the cathode region 2 are either at the same vertical height as in FIG. 3 or they are vertically offset to one another as in FIG. 4.

In the illustrated examples of FIGS. 1 to 4, the anode and cathode regions directly border the compensation layers 6 and 7, but there can also be intervals in between. For making contact, an anode terminal 10 with an anode contact A is attached to the anode region 1, a cathode terminal 11 with an cathode contact K is attached to the cathode region 2. The lateral length of the base region 3 between the anode region 1 and the cathode region 2 is for example 2 mm, the lateral length of the anode region 1 and the cathode region 2 is 0.3 mm each, the vertical width of the base region 3 including the compensation layers 6 and 7 is for example 0.4 mm. Thus, the lateral length of the base region 3 is roughly five times its vertical width. The doping of the base region is for example $3.5 \times 10^{17}$ $cm^{-3}$. The p-conductive compensation layers can for example also be formed by ion implantation and with respect to the dopant concentration show concentration variations with a surface concentration of $10^{17}$ $cm^{-3}$ and a penetration depth of 0.31 microns; this corresponds to a dopant surface concentration of $7 \times 10^{11}$ $cm^{-2}$ per compensation layer. At the penetration depth thus the dopant surface concentrations of the base region and the compensation layers correspond and are each $2 \times 7 \times 10^{11}$ $cm^{-2}$, here the penetration depth can be regarded as the vertical thickness $d_6$, $d_7$ of the compensation layers. Furthermore, the compensation layers can also be applied by epitaxy with the corresponding vertical thickness.

Figure 5:
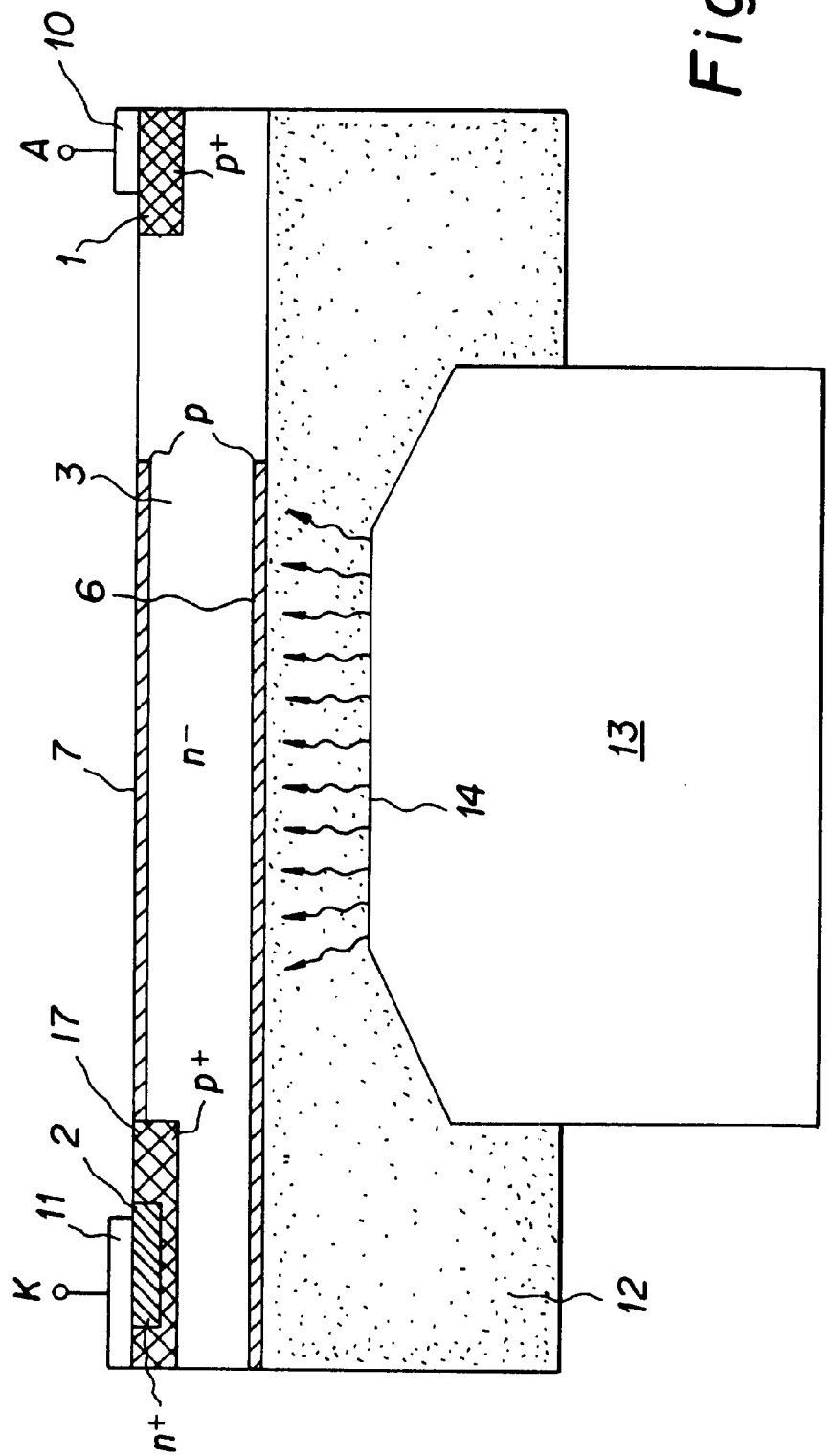
FIG. 5 shows a phototriggerable thyristor as the fifth embodiment of the invention.

For the phototriggerable thyristor as shown in FIG. 5, between the cathode region 2 and the base region 3 there is additionally a $p^+$-conductive fourth region 17 which is partially also in contact with the cathode terminal 11. Thus the cathode region 2, the fourth region 17, the base region 3 and the anode region 1 form a four-layer thyristor, and in one part of the base region 3 via the transparent connecting region 12 light of a LED 13 can be emitted via its side surface 14 which faces the base region. As claimed in the invention, the compensation regions 6 and 7 extend at least over this part of the base region 3 which is exposed to light so that here too at least partial compensation of the space charges of the base region 3 and the compensation layers 6 and 7 occurs.

Figure 6:
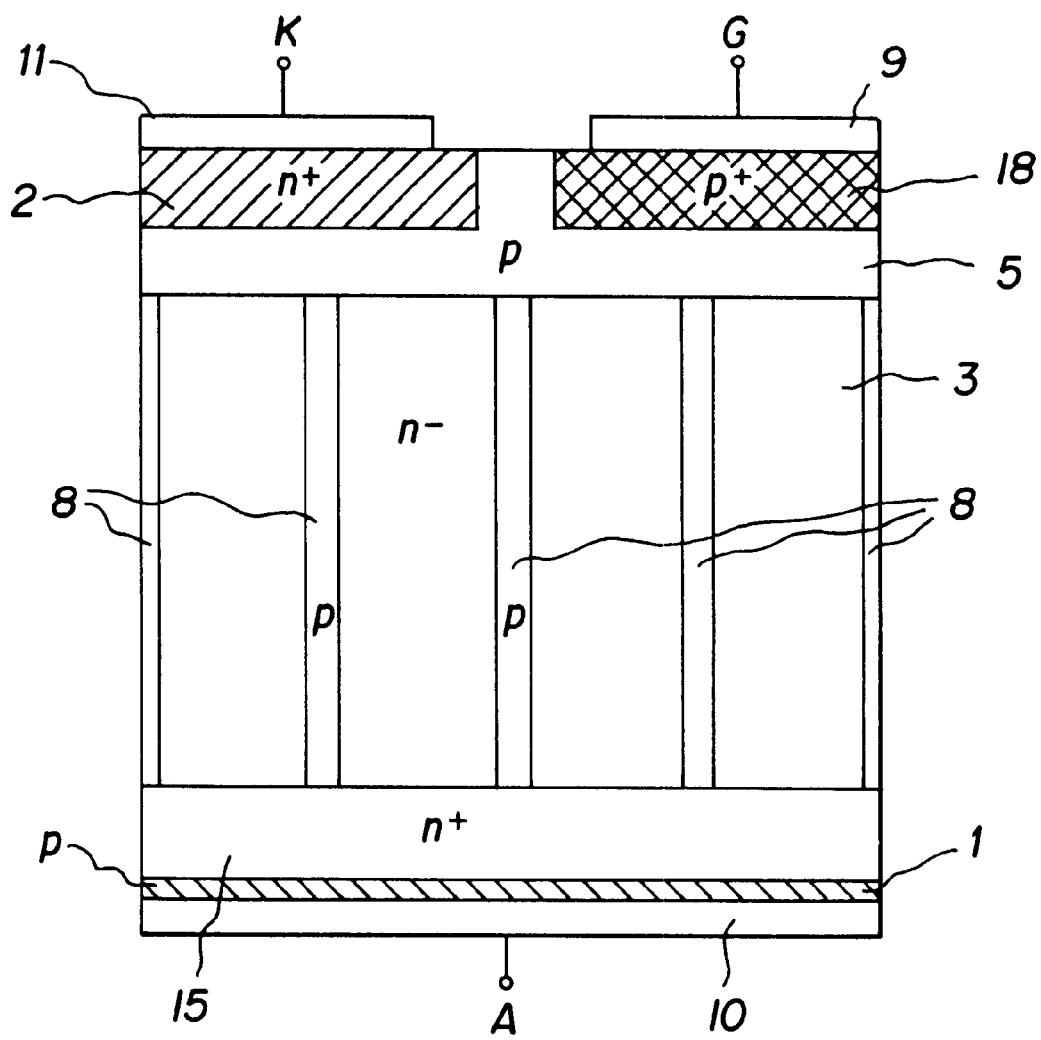
FIG. 6 shows a gate turn-off thyristor as the sixth embodiment of the invention.

In the gate turn-off transistor as shown in FIG. 6, between the $n^+$-conductive cathode region 2 and the p-conductive anode region 1 which is made as an anode emitter, a p-base 5, a $n^-$-base 3 and a $n^+$-buffer 15 are formed. The gate terminal 9 with the gate contact G is likewise connected to the p-base 5 via a $p^+$-conductive gate region 18. As claimed in the invention, compensation layers 8 are formed from p-conductive silicon as strips or channels outside and/or inside the $n^-$-base 3 in the lateral direction which points up in the drawing. Here the strips extend over the entire thickness of the semiconductor component (y direction), channels are surrounded by the $n^-$-base region. Thus higher currents can be achieved through the base region 3 by forming several layers. The lateral extension of the compensation structures is for example 2 microns, the cell width is 300 microns, large areas can be formed by the arrangement of several cells next to one another.

The compensation layers 8 can extend to the buffer region 15 or, depending on the desired field strength distribution, end before. Production can be done by etching grooves or channels and subsequent doping, for example by filling with doped polysilicon or by diffusion. FIG. 6 shows an individual structural cell which can be continued periodically in the lateral direction in order to achieve for example component areas from 50 to 70 cm².

Figure 7:
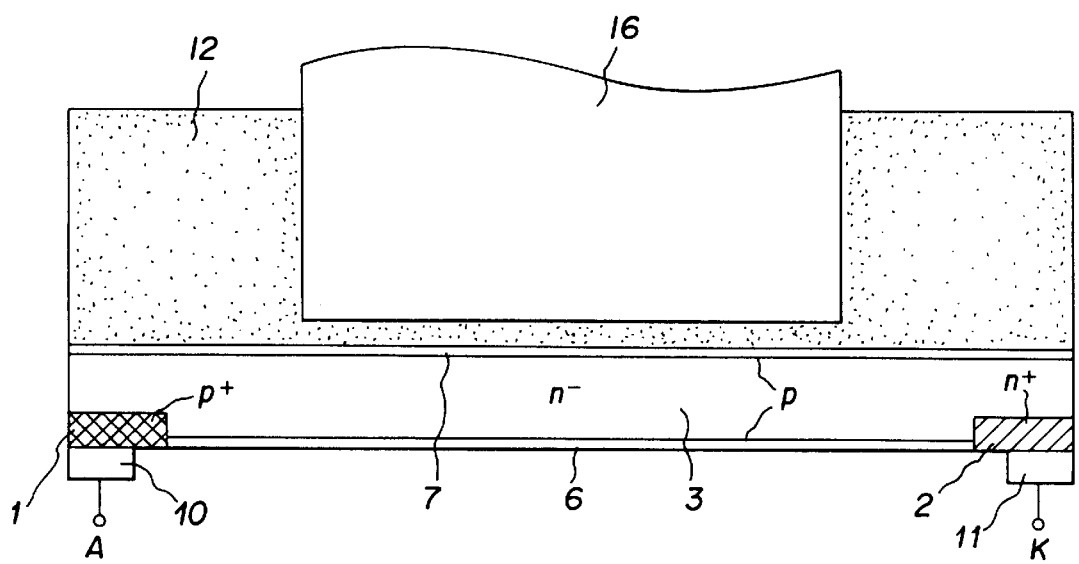
FIG. 7 shows a photodiode as the seventh embodiment of the invention.

The photodiode for producing high voltage pulses as shown in FIG. 7 has a structure similar to the diode from FIG. 3. The part of the base area 3 exposed to external light radiation is thus surrounded accordingly by compensation layers 6 and 7 so that here complete or partial compensation of the space charge of the n⁻-conductive base region 3 and the p-conductive compensation layers 6 and 7 is achieved. This photodiode can accordingly be built up also with the anode region 1 and the cathode region 2 offset vertically to one another as shown in FIG. 4. Injection of light signals can be done via a transparent connecting region 12 and an optical fiber 16. The component should be dimensioned preferably such that the electrical field strength in the space charge zone at the prevailing blocking voltage is 60% to 70% of the breakdown field strength of silicon. Corresponding irradiation results in that in the irradiated space of the space charge zone a high concentration of free charge carriers is generated. These charge carriers carry a current which flows in the unirradiated regions of the space charge zone as a displacement current.

The leads to an increase of the field strength in the unilluminated region of the space charge zone which ultimately results in strong ionization when the breakdown field strength is reached. The diode is this suddenly flooded with charge carriers and becomes conductive. The voltage over the diode collapses almost completely. Since these processes proceed very quickly, on a series-connected load voltage rise speeds of more than 100 kV/microsecond can thus be achieved. As a result of the remaining voltage on the diode, the generated charge carriers drain, after this current pulse the diode passes back into its blocking state.

By illumination of the base region and the diode from FIG. 7 over a correspondingly large area triggering times in the nanosecond range can be achieved.

| Reference number list | |
|---|---|
| 1 | anode region |
| 2 | cathode region |
| 3 | base region |
| 5 | second base region |
| 6, 6a,b,c | compensation layer |
| 7, 7a,b,c | compensation layer |
| 8 | compensation layer |
| 9 | gate terminal |
| 10 | anode terminal |
| 11 | cathode terminal |
| 12 | transparent connecting region |
| 13 | LED |
| 14 | side surface of the LED |
| 15 | buffer region |
| 16 | optical fiber |
| 17 | fourth region |
| 18 | gate region |
| A | anode contact |
| K | cathode contact |
| G | gate contact |
| a,b,c | sections of the semiconductor component in the lateral direction |
| E | electrical field strength |

| -continued | |
|---|---|
| Reference number list | |
| x | lateral direction |
| z | vertical direction |

What is claimed is:

1. Semiconductor component, especially for high voltage applications, with low-doped base region (3) of the first conductivity type (n) extending in the lateral direction (x),
   two terminal areas (1, 2) which are separated at least by the base region (3) in the lateral direction (x) for connection to electrical contacts (A, K), characterized in that
   the base material of the base region (3) is silicon (Si), with a dopant concentration of $10^{12}$ to $5 \times 10^{14}$ cm⁻³, the dopant surface concentration ($N_A$) which has been determined by integration of the dopant concentration over the vertical thickness of the base region (3) along the lateral direction (x) being less than $2 \times 10^{12}$ cm⁻², and
   there are compensation layers (6, 6a, 6b, 6c, 7, 7a, 7b, 7c, 8) of the second conductivity type (p) opposite the first conductivity type which extend inside or outside the base region in the lateral direction (x), the lateral length ($l_K$) of the compensation layers being greater than their vertical thickness ($d_6$, $d_7$) and a dopant surface concentration ($N_A$) which has been determined by integration of the dopant concentration over the vertical thickness of a compensation layer along the lateral direction (x) being less than $1 \times 10^{12}$ cm⁻².

2. Semiconductor component as claimed in claim 1, wherein the lateral length (L) of the base region (3) is greater than the vertical thickness (d) of the base region.

3. Semiconductor component as claimed in claim 1, wherein in the first sections (a) along the lateral direction (x) the dopant surface concentration of the compensation layers (6a, 7a) which has been determined by integration of the dopant concentration over the vertical thickness is greater than the dopant surface concentration of the base region (3a) which has been determined by integration of the dopant concentration over the vertical thickness.

4. Semiconductor component as claimed in claim 1, wherein in the second sections (b) along the lateral direction (x) the dopant surface concentration of the compensation layers (6b, 7b) which has been determined by integration of the dopant concentration over the vertical thickness corresponds to the dopant surface concentration of the base region (3b) which has been determined by integration of the dopant concentration over the vertical thickness.

5. Semiconductor component as claimed in claim 1, wherein in the third sections (c) along the lateral direction (x) the dopant surface concentration of the compensation layers (6c, 7c) which has been determined by integration of the dopant concentration over the vertical thickness is less than the dopant surface concentration of the base region (3c) which has been determined by integration of the dopant concentration over the vertical thickness.

6. Semiconductor component as claimed in claim 3, wherein in the lateral direction (x) it has several successive sections (a, b, c) with different dopant concentration of the compensation layers (6a, 6b, 6c, 7a, 7b, 7c).

7. Semiconductor component as claimed in claim 1, wherein the base material has a dopant concentration from $4 \times 10^{12}$ to $4 \times 10^{14}$, especially $8 \times 10^{12}$ to $10^{14}$ cm⁻³.

8. Semiconductor component as claimed in claim 1, wherein the compensation layers (6, 6a, 6b, 6c, 7, 7a, 7b, 7c) are formed on the outside surfaces of the base region (3).

9. Semiconductor component as claimed in claim 1, wherein the compensation layers (8) are located within the base region and preferably divide the base region (3) into several component regions.

10. Semiconductor component as claimed in claim 1, wherein the anode region (1) and/or the cathode region (2) border the compensation layers (6, 7).

11. Semiconductor component as claimed in claim 10, wherein the anode region (1) and/or the cathode region (2) extend only partially over the vertical thickness of the base region (3).

12. Semiconductor component as claimed in claim 11, wherein the anode region (1) and the cathode region (2) are at the same vertical height.

13. Semiconductor component as claimed in claim 11, wherein the anode region (1) and the cathode region (2) are arranged vertically offset to one another.

14. Semiconductor component as claimed in claim 10, wherein it is made as a diode, preferably a high voltage diode.

15. Semiconductor component as claimed in claim 14, wherein it is made as a photodiode, there being compensation layers (6, 7) in the part of the base region (3) which can be exposed to light radiation.

16. Semiconductor component as claimed in claim 10, wherein it is made as a thyristor, between the $n^+$-conductive cathode region (2) and the n-conductive base region (3) a p-conductive fourth region (5, 17) being formed.

17. Semiconductor component as claimed in claim 16, wherein it its made as a phototriggerable thyristor, the part of the base region (3) which can be exposed to light radiation having compensation layers (6, 7).

18. Semiconductor component as claimed in claim 16, wherein it is made as a thyristor triode, the p-conductive fourth region being made as a second base region (5) and the gate region (18) of $p^+$-conductive semiconductor material for connection to the gate contact (G) bordering the second base region (5).

19. Semiconductor component as claimed in claim 18, wherein a $n^+$-conductive buffer region is formed between the base region (4) and the anode region (1).

* * * * *